United States Patent [19]

Tanaka

[11] Patent Number: 4,958,092
[45] Date of Patent: Sep. 18, 1990

[54] INTEGRATED CIRCUIT DEVICE HAVING ROW STRUCTURE WITH CLOCK DRIVER AT END OF EACH ROW

[75] Inventor: Shigeru Tanaka, Fujisawa, Japan

[73] Assignee: Kabushiki Kaisha Toshiba, Kawasaki, Japan

[21] Appl. No.: 329,908

[22] Filed: Mar. 28, 1989

[30] Foreign Application Priority Data

Mar. 29, 1988 [JP] Japan ............................ 63-73285

[51] Int. Cl.⁵ ................. H03K 3/26; H03K 19/02; G06F 15/606
[52] U.S. Cl. ........................ 307/480; 307/303; 307/303.1; 307/443; 307/269
[58] Field of Search ............... 307/480, 303, 303.1, 307/5, 443, 269

[56] References Cited

U.S. PATENT DOCUMENTS 4,577,276 3/1986 Dunlop et al. .................. 364/488
4,857,765 8/1989 Cahill et al. .................... 307/443

Primary Examiner—Stanley D. Miller
Assistant Examiner—Margaret Rose Wambach
Attorney, Agent, or Firm—Finnegan, Henderson, Farabow, Garrett, and Dunner

[57] ABSTRACT

In an integrated circuit device such as a logic LSI having a row structure, each row includes a group of logic elements and a clock driver. The clock driver in each row is arranged at one end of the row so as to shorten the distances from the clock driver to a primary power supply wiring and a primary ground wiring.

4 Claims, 5 Drawing Sheets

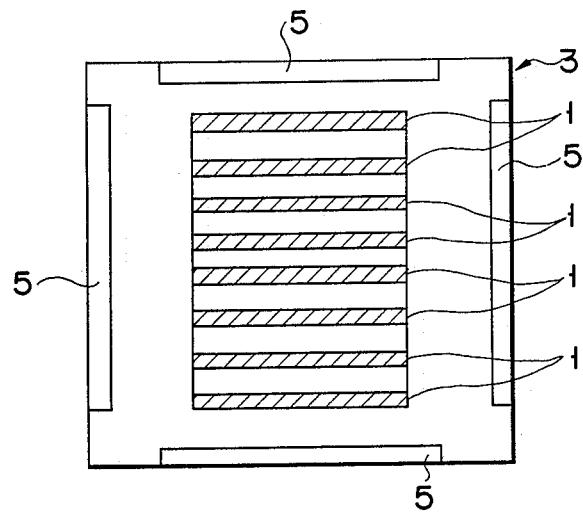
F I G. 1     (PRIOR ART)
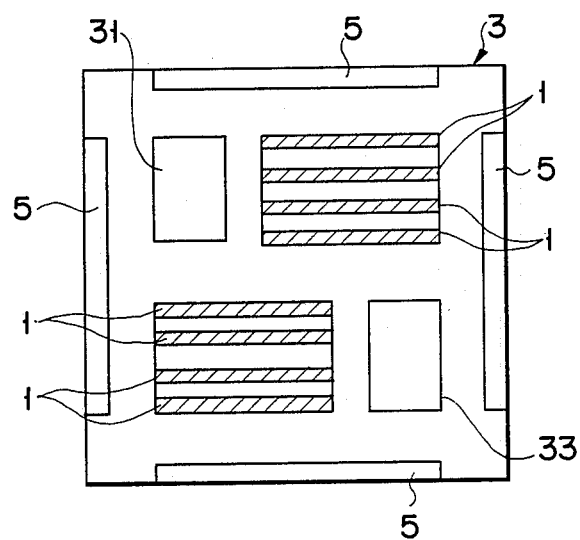
F I G. 2     (PRIOR ART)

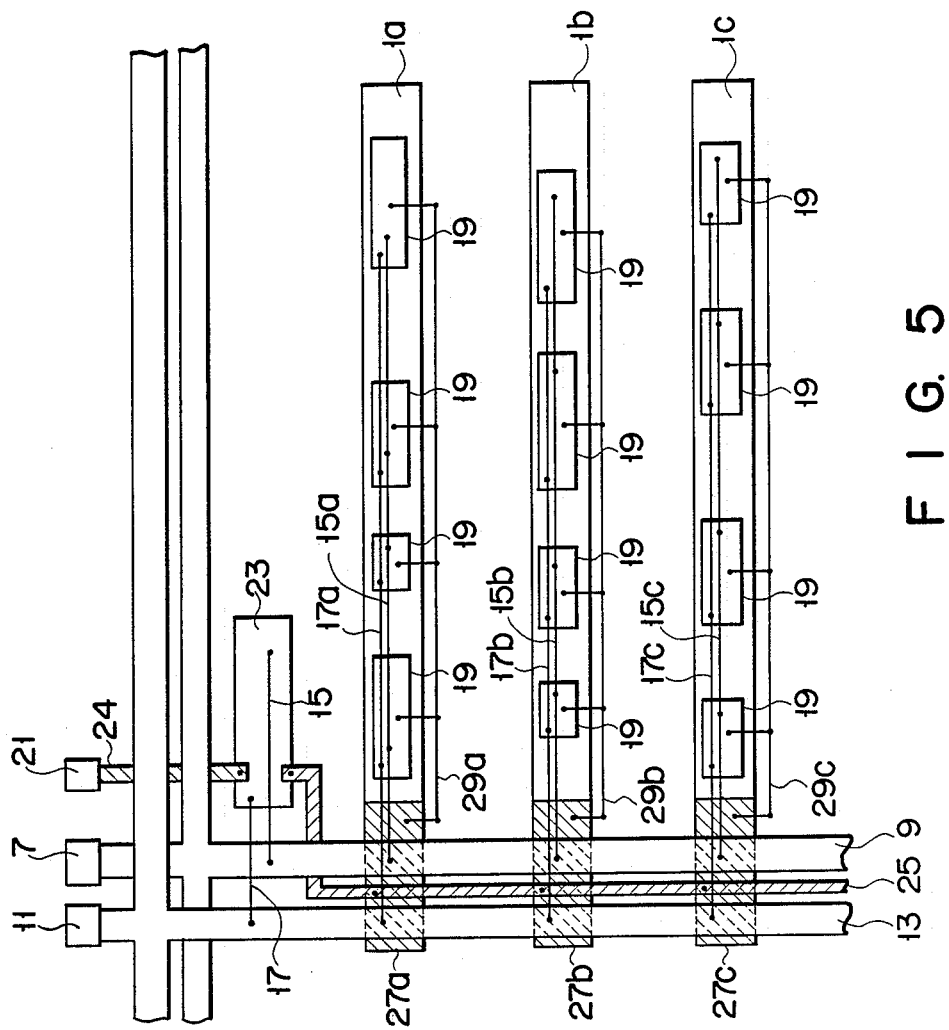
F I G. 5

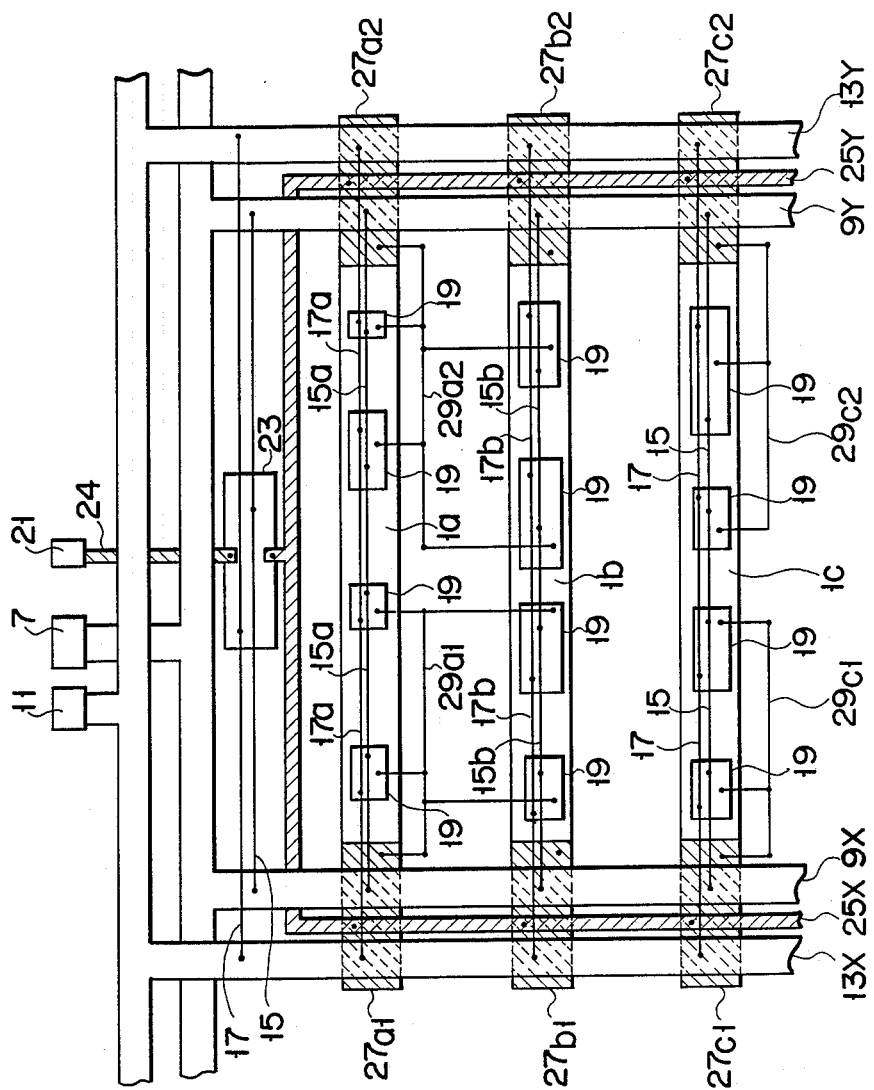
F I G. 6

INTEGRATED CIRCUIT DEVICE HAVING ROW STRUCTURE WITH CLOCK DRIVER AT END OF EACH ROW

BACKGROUND OF THE INVENTION

1. Field of the Invention

The present invention relates to an integrated circuit device such as a logic LSI using a clock signal and, more particularly, to an improvement of an integrated circuit device having a row structure.

2. Description of the Related Art

FIG. 1 is a block diagram of a conventional integrated circuit device such as a logic LSI, in which a plurality of rows are arranged parallel to each other, i.e., a so-called row structure logic LSI. More specifically, rows 1 in an LSI 3 respectively include a plurality of logic elements such as flip-flops, registers, and latches, and input/output blocks 5 are arranged at four sides of the LSI 3.

FIG. 2 is a block diagram of a conventional logic LSI employing a macro block structure. In FIG. 2, a plurality of rows are arranged in one block to be parallel to each other, and a plurality of blocks including these rows are arranged in a LSI 3 together with a RAM 31, a ROM 33, and so on. In this chip, input/output blocks 5 are arranged at four sides of the LSI 3.

The internal arrangement and the connection relationship of the plurality of rows are shown in detail in FIG. 3. Referring to FIG. 3, the rows 1 are arranged to be parallel to each other. Each row is connected to a primary power supply wiring 9 and a primary ground wiring 13 through a secondary power supply wiring 15 and a secondary ground wiring 17, respectively. The primary power supply wiring 9 is connected to a power supply through a power supply terminal 7 serving as a part of the input/output block 5. The primary ground wiring 13 is grounded through a ground terminal 11 serving as a part of the input/output block 5 to hold a reference potential. A plurality of logic elements 19 in the plurality of rows 1 are driven by a clock signal. When a hierarchical clock driving system is applied, the input terminal of a primary clock driver 23 is connected to a clock signal input terminal 21 serving as a part of the input/output block 5 through a clock signal input wiring 24. The output terminal of the primary clock driver 23 is connected to the input terminals of a plurality of secondary clock drivers 27 through a clock signal input wiring 25. Note that the driving capability of the plurality of secondary clock drivers 27 is generally smaller than that of the primary clock driver 23. The power supply and ground terminals of the primary clock driver 23 are connected to the primary power supply wiring 9 and the primary ground wiring 13 through the secondary power supply wiring 15 and the secondary ground wiring 17, respectively. In addition, the output terminals of the plurality of secondary clock drivers 27 are connected to the plurality of logic elements 19 through clock signal output wirings 29, respectively.

As described above, in the conventional LSI, since the distances from each secondary clock driver 27 to the primary power supply wiring 9 and to the primary ground wiring 13 are large, noise is often generated on the secondary power supply wirings 15 and the secondary ground wirings 17, upon operation of the secondary clock drivers 27.

SUMMARY OF THE INVENTION

An integrated circuit device of the present invention has been made in order to solve the above problems and the present invention has as its object to provide an integrated circuit device for reducing noise in an LSI having a row structure using a clock signal.

In order to achieve the above object, an integrated circuit of the present invention comprises:

a primary power supply wiring (9) connected to a power supply;

a primary ground wiring (13) connected to a ground terminal, for holding a reference potential;

primary clock driver means (23) for receiving a clock signal from a clock signal input terminal;

a first clock signal input wiring (24) for connecting the clock signal input terminal to the primary clock driver means;

a first row including a first secondary clock driver (27a) arranged at one end of the first row to be adjacent to the primary power supply wiring and the primary ground wiring, the first secondary clock driver having a clock signal input terminal connected to the primary clock driver means, a power supply terminal connected to the primary power supply wiring, and a ground terminal connected to the primary ground wiring, and a first group of a plurality of logic elements (19), which switch synchronously with the input clock signal, each having a power supply terminal and a ground terminal respectively connected to the primary power supply wiring and the primary ground wiring;

a first secondary power supply wiring (15a) for connecting the primary power supply wiring to the power supply terminal of the first secondary clock driver in the first row, and to the power supply terminals of the first group of logic elements;

first secondary ground wiring (17a) for connecting the primary ground wiring to the ground terminal of the first secondary clock driver in the first row, and to the ground terminals of the logic elements;

a second row arranged parallel to the first row, the second row including a second secondary clock driver (27b) arranged at one end of the second row to be adjacent to the primary power supply wiring and the primary ground wiring, the second secondary clock driver (27b) having a clock signal input terminal connected to the primary clock driver means, a power supply terminal connected to the primary power supply wiring, and a ground terminal connected to the primary ground wiring, and a second group of a plurality of logic elements (19), which switch synchronously with the input clock signal, each having a power supply terminal and a ground terminal respectively connected to the primary power supply wiring and the primary ground wiring;

a second secondary power supply wiring (15b) for connecting the primary power supply wiring to the power supply terminal of the second secondary clock driver in the second row, and to the power supply terminals of the second group of logic elements;

a second secondary ground wiring (17b) for connecting the primary ground wiring to the ground terminal of the second secondary clock driver in the second row and to the ground terminals of the logic elements;

a second clock signal input wiring (25) arranged along the direction perpendicular to the longitudinal direction of the first and second rows, for connecting the input terminals of the first and second secondary clock drivers (27a and 27b) to an output terminal of the first clock driver means;

a first clock signal wiring (29a) for connecting the output of first secondary clock driver means in the first row to the first group of logic elements; and a second clock signal wiring (29b) for connecting the output of second secondary clock driver means in the second row to the second group of logic elements.

With the above arrangement, the integrated circuit device according to the present invention can shorten the distances from the primary supply wiring and the primary ground wiring to secondary clock driver means by arranging each secondary clock driver means at one end of the corresponding parallel row. Therefore, noise generated on the secondary power supply wiring and the secondary ground wiring can be reduced.

BRIEF DESCRIPTION OF THE DRAWINGS

FIG. 1 is a block diagram showing a conventional logic LSI employing a row structure, in which a plurality of rows are arranged parallel to each other;

FIG. 2 is a block diagram showing a conventional logic LSI employing a macro block structure, in which a plurality of rows are arranged parallel to each other in one block, and a plurality of blocks including the rows are arranged in the LSI;

FIG. 5 is a block diagram showing an arrangement of the integrated circuit device according to another embodiment of the present invention; and FIG. 6 is a block diagram showing an arrangement of the integrated circuit device according to still another embodiment of the present invention.

DETAILED DESCRIPTION OF THE PREFERRED EMBODIMENTS

Figure 3:
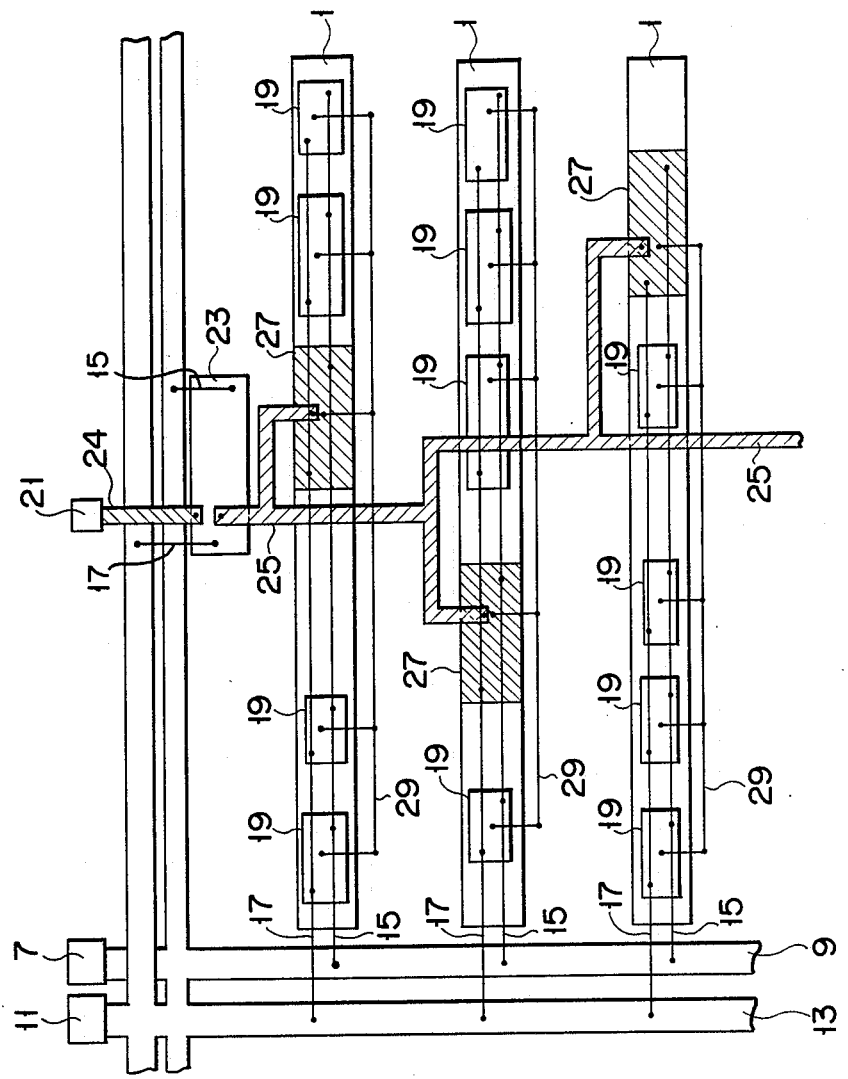
FIG. 3 is a block diagram showing the internal arrangement and the connection relationship of the plurality of rows in FIGS. 1 and 2.
Figure 4:
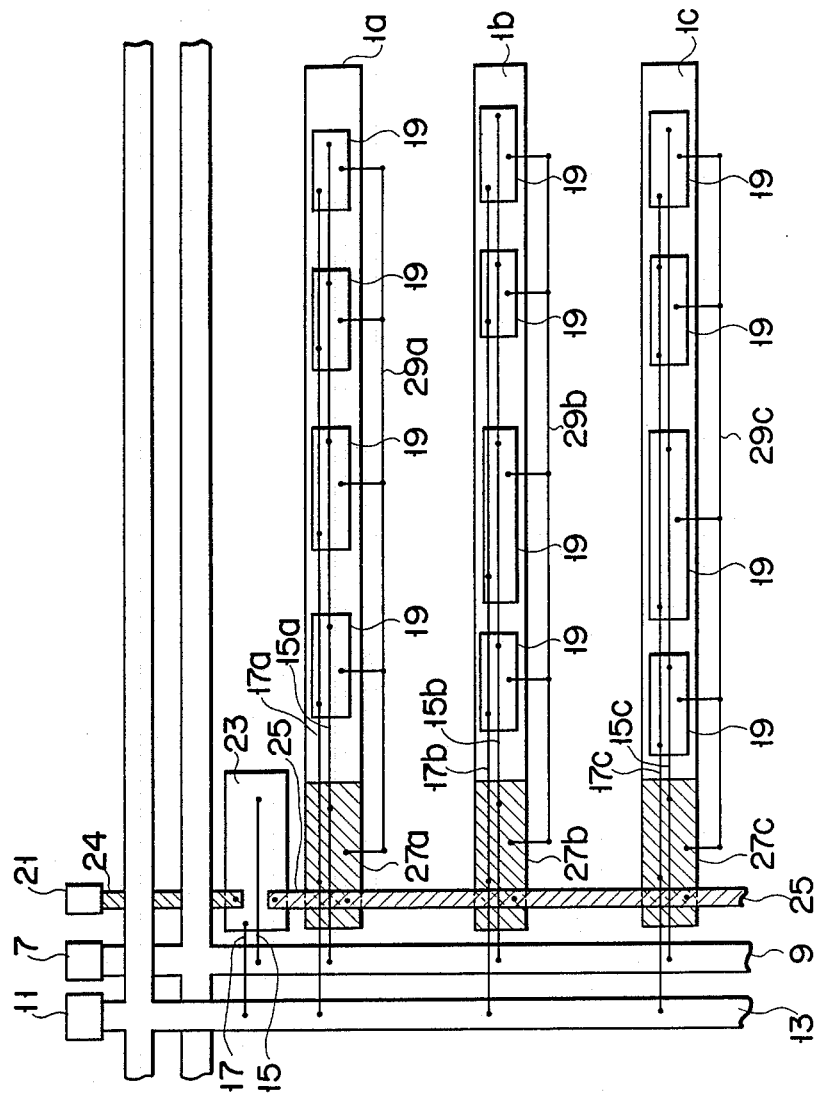
FIG. 4 is a block diagram showing an arrangement of an integrated circuit device according to an embodiment of the present invention.

Embodiments of an integrated circuit device according to the present invention will be described hereinafter with reference to FIGS. 4 to 6.

First, an arrangement according to an embodiment of the present invention in FIG. 4 will be described below. A primary clock driver 23 is connected to a clock signal input terminal 21 serving as a part of one of input/output blocks 5 which are the same as those in FIGS. 1 and 2, through a primary clock signal wiring 24. The primary clock driver 23 has an inverter (not shown) and outputs an output signal in response to a clock input signal. A plurality of rows 1a, 1b, and 1c respectively include a plurality of logic elements 19 such as flip-flops, registers, latches, and so on, and are arranged parallel. The plurality of rows respectively include secondary clock drivers 27a, 27b, and 27c, each having a smaller driving capability than that of the primary clock driver 23 including the inverter. The secondary clock drivers 27a, 27b, and 27c are respectively positioned on end portions of the plurality of rows 1a, 1b, and 1c to be adjacent to a primary power supply wiring 9 and a primary ground wiring 13. The primary power supply wiring 9 and the primary ground wiring 13 are arranged adjacent to the end portions of the rows 1a, 1b, and 1c, along the direction perpendicular to the longitudinal direction of the plurality of rows 1. The clock signal input wiring 25 is arranged in the direction perpendicular to the longitudinal direction of the rows 1a, 1b, and 1c. In addition, the input terminals of the secondary clock drivers 27a, 27b, and 27c are connected to the output terminal of the primary clock driver 23 through the clock signal input wiring 25. The output terminals of the plurality of secondary clock drivers 27a, 27b, and 27c are connected to the plurality of logic elements 19 in the plurality of rows 1a, 1b, and 1c, through clock signal wirings 29a, 29b, and 29c, respectively. The primary power supply wiring 9 and the primary ground wiring 13 are connected to a power supply terminal 7 and a ground terminal 11 serving as parts of the input/output blocks 5, respectively. The primary power supply wiring 9 and the primary ground wiring 13 are also connected to the power supply terminal and the ground terminal of the primary clock driver 23, the power supply terminals and the ground terminals of the plurality of secondary clock drivers 27a, 27b, and 27c, and the power supply terminals and the ground terminals of the plurality of logic elements 19, through secondary power supply wirings 15a, 15b, and 15c, and secondary ground wirings 17a, 17b, and 17c, respectively. Note that if either the primary power supply wiring 9 or the primary ground wiring 13 is arranged adjacent to the rows 1a, 1b, and 1c, the same effect can be obtained.

The effect of the above embodiment will be described hereinafter. In the above embodiment, the distances from the primary power supply wiring 9 and the primary ground wiring 13 to the plurality of secondary clock drivers 27a, 27b, and 27c are shortened, and the resistance, the capacitance, and the impedance of wiring are decreased. Therefore, clock signal switching noise, which causes an operation error of the plurality of logic elements 19 can be suppressed. More specifically, in the leading and trailing edges of the clock signal, due to a switching operation of all the secondary clock drivers 27a, 27b, and 27c, although a large amount of current flows through the secondary power supply wirings 15a, 15b, and 15c, and the secondary ground wirings 17a, 17b, and 17c, the generated noise can be effectively reduced.

The clock signal input wiring 25 is arranged along the direction perpendicular to the longitudinal direction of the plurality of rows 1a, 1b, and 1c to connect the primary clock driver 23 to the plurality of secondary clock drivers 27a, 27b, and 27c, so that the area of the clock signal input wiring 25 in spaces between the plurality of rows 1a, 1b, and 1c is decreased. Therefore, the integration of the LSI is improved, and hence the resistance and capacitance of the clock signal input wiring 25 are decreased. As a result, a skew which is an RC delay caused by the resistance and the capacitance can be effectively reduced as compared to the conventional arrangement.

An arrangement according to a second embodiment shown in FIG. 5 will be described below. In the second embodiment, a plurality of secondary clock drivers 27a, 27b, and 27c are respectively positioned at corresponding ends of a plurality of rows 1a, 1b, and 1c in their longitudinal direction. A primary power supply wiring 9 and a primary ground wiring 13 are arranged on the plurality of secondary clock drivers 27a, 27b, and 27c. In addition, a clock signal input wiring 25 is interposed between the primary power supply wiring 9 and the primary ground wiring 13, and sources (not shown) of the secondary clock drivers 27a, 27b, and 27c are connected to the primary power supply wiring 9 and the primary ground wiring 13. Other arrangements are the same as those in the first embodiment.

The effect of the second embodiment will be described below. In the second embodiment, the same effect as in the first embodiment can be obtained In addition, the distances from the primary power supply wiring 9 and the primary ground wiring 13 to the plurality of secondary clock drivers 27a, 27b, and 27c are further shortened as compared with the first embodiment. Clock signal switching noise which causes an operation error of the plurality of logic elements 19 can be further suppressed as compared to the first embodiment. More specifically, in the leading and trailing edges of the clock signal, due perform a switching operation of all the secondary clock drivers 27a, 27b, and 27c, although a large amount of current flows through the secondary power supply wirings 15a, 15b, and 15c, and the secondary ground wirings 17a, 17b, and 17c, the generated noise can be further effectively reduced as compared with the first embodiment.

An arrangement according to a third embodiment shown in FIG. 6 will be described below. In the third embodiment, pairs of secondary clock drivers 27a1 and 27a2, 27b1 and 27b2, and 27c1 and 27c2 are respectively arranged on both ends of a plurality of rows 1a, 1b, and 1c in their longitudinal direction. In addition, in the same manner as in the second embodiment, primary power supply wirings 9X and 9Y, primary ground wirings 13X and 13Y, and clock signal input wirings 25X and 25Y are linearly arranged on both the ends of the plurality of rows 1a, 1b, and 1c, and on the secondary clock drivers 27a1 and 27a2, 27b1 and 27b2, and 27c1 and 27c2, respectively, in a direction perpendicular to the longitudinal direction in the same manner as in the second embodiment. Furthermore, a plurality of logic elements 19 are connected to the primary power supply wirings 9X and 9Y, and the primary ground wirings 13X and 13Y, through the secondary power supply wirings 15a 15b, and 15c, and the secondary ground wirings 17a, 17b, and 17c in each row, respectively.

The effect of the third embodiment will be described hereinafter. In the third embodiment, in addition to the effect of the second embodiment, the number of secondary clock drivers 27a1 and 27a2, 27b1 and 27b2, and 27c1 and 27c2 respectively included in the plurality of rows 1a, 1b, and 1c can be set to be optimal number for reducing the skews of the clock signal wirings 29a1 and 29a2, depending on the number of gates in the plurality of rows 1a, 1b, and 1c, on the load, and so on. More specifically, in the third embodiment, the pairs of secondary clock drivers 27a1 and 27a2, 27b1 and 27b2, and 27c1 and 27c2 are respectively arranged in the plurality of rows 1a, 1b, and 1c. However, the number of secondary clock drivers 27 included in the plurality of rows 1a, 1b, and 1c is not limited to two, and the optimal number can be determined to reduce the skew of the clock signal wirings 29a1 and 29a2 depending on the amount of the load. Thus, the distances from the output terminals of the secondary clock drivers 27 to the plurality of logic elements 19 are shortened, so that the capacitance and resistance of each clock signal output wiring 29 can be decreased, thereby reducing the skew.

Although the above three embodiments have been described, the present invention is not limited thereto. For example, the above-mentioned secondary clock drivers 27 are not required for all the plurality of rows 1, and the secondary clock drivers 27 can be arranged every several rows.

The above-mentioned secondary clock drivers 27 can be arranged by automatic design, and can be manually arranged by a small number of steps.

In the above-described three embodiments, the distances from the primary power supply wiring 9 and the primary ground wiring 13 to the power supply and ground terminals of the secondary clock drivers 27 in the plurality of rows 1 are further shortened as compared with the conventional arrangement, so that noise generated on the secondary power supply wiring 17 and the secondary ground wiring 15 can be effectively suppressed.

What is claimed is:

1. An integrated circuit device comprising:
   a primary power supply wiring connected to a power supply;
   a primary ground wiring connected to a ground terminal, for holding a reference potential;
   primary clock driver means, for receiving a clock signal from a clock signal input terminal;
   a first clock signal input wiring for connecting said clock signal input terminal to said primary clock driver means;
   a first row including a first secondary clock driver arranged at one end of said first row to be adjacent to a primary power supply wiring and a primary ground wiring, said first secondary clock driver having a clock signal input terminal connected to said primary clock driver means, a power supply terminal connected to said primary power supply wiring, and a ground terminal connected to said primary ground wiring, and a first group of a plurality of logic elements, which switch synchronously with the input clock signal, each having a power supply terminal and a ground terminal respectively connected to said primary power supply wiring and said primary ground wiring;
   a first secondary power supply wiring for connecting said primary power supply wiring to said power supply terminal of said first secondary clock driver in said first row, and to said power supply terminals of said first group of logic elements;
   a first secondary ground wiring for connecting said primary ground wiring to said ground terminal of said first secondary clock driver in said first row, and to said ground terminals of said logic elements;
   a second row arranged parallel to a longitudinal direction of said first row, said second row including a second secondary clock driver arranged at one end of said second row to be adjacent to said primary power supply wiring and said primary ground wiring, said second secondary clock driver having a clock signal input terminal connected to said primary clock driver means, a power supply terminal connected to said primary power supply wiring, and a ground terminal connected to said primary ground wiring, and a second group of a plurality logic elements, which switch synchronously with the input clock signal, each having a power supply terminal and a ground terminal respectively connected to said primary power supply wiring and said primary ground wiring;
   a second secondary power supply wiring for connecting said primary power supply wiring to said power supply terminal of said second secondary clock driver in said second row, and to said power supply terminals of said second group of logic elements;

a second secondary ground wiring for connecting said primary ground wiring to said ground terminal of said second secondary clock driver in said second row and to said ground terminals of said logic elements;

a second clock signal input wiring for connecting the input terminals of said first and second secondary clock drivers and to an output terminal of said primary clock driver means;

a first clock signal wiring for connecting said first secondary clock driver means in said first row to said logic elements; and a second clock signal wiring for connecting said second secondary clock driver means in said second row to said logic elements.

2. A device according to claim 1, wherein said primary power supply wiring, said primary ground wiring, and said second clock signal input wiring are arranged in a direction perpendicular to the longitudinal direction of said first and second rows, and arranged on said first and second secondary clock drivers corresponding to said first and second rows.

3. A device according to claim 1, comprising:

first and second primary power supply wirings commonly connected to said power supply, and divided to be arranged as two lines;

first and second primary ground wirings commonly connected to said ground terminal, and divided to be arranged as two lines, for holding a reference potential;

primary clock driver means, for receiving the clock signal from said clock signal input terminal;

a first clock signal input wiring for connecting said clock signal input terminal to said primary clock driver means;

a first row including first and second secondary clock drivers, said drivers respectively having clock signal input terminals connected to said primary clock driver means, power supply terminals respectively connected to said first and second primary power supply wirings, and ground terminals respectively connected to said first and second primary ground wirings, a first group of a plurality of logic elements, which switch synchronously with the input clock signal, each having power supply terminals and ground terminals respectively connected to said first and second primary power supply wirings and said first and second primary ground wirings;

a first secondary power supply wiring for respectively connecting said first and second primary power supply wirings to said power supply terminals of said first and second secondary clock drivers in said first row, and to said power supply terminals of said first group of logic elements;

a first secondary ground wiring for respectively connecting said first and second primary ground wirings to said ground terminals of said first and second secondary clock drivers in said first row, and to said ground terminals of said first group of logic elements;

a second row arranged parallel to the longitudinal direction of said first row, said second row including first and second secondary clock drivers, said drivers respectively having clock signal input terminals connected to said primary clock driver means, power supply terminals connected to said first and second primary power supply wirings, and ground terminals connected to said first and second primary ground wirings, and a second group of a plurality of logic elements, which switch synchronously with the input clock signal, each having power supply terminals and ground terminals respectively connected to said first and second primary power supply wirings and said first and second primary ground wirings;

a second secondary power supply wiring for connecting said first and second primary power supply wirings to said power supply terminals of said first and second secondary clock drivers in said second row and to said power supply terminals of said second group of logic elements;

a second secondary ground wiring for respectively connecting said first and second primary ground wirings to said ground terminals of said first and second secondary clock drivers in said second row, and to said ground terminals of said second group of logic elements;

secondary clock signal input wirings divided from an output terminal of said primary clock driver means, and respectively connected to said first secondary clock drivers, and to said second secondary clock drivers, respectively, included in said first and second rows;

a first clock signal wiring for commonly connecting said first secondary clock driver in said first row to logic elements corresponding to said first and second rows and included therein; and a second clock signal wiring for commonly connecting said second secondary clock driver in said first row to said logic elements corresponding to said first and second rows and included therein.

4. A device according to claim 3, wherein said first and second primary power supply wirings, said first and second primary ground wirings, and said secondary clock signal input wirings are arranged in a direction perpendicular to the longitudinal direction of said first and second rows, and arranged on said first and second secondary clock drivers.

* * * * *